US008169271B2

(12) United States Patent
Goyal et al.

(10) Patent No.: US 8,169,271 B2

(45) Date of Patent: May 1, 2012

(54) INTERFERENCE RESISTANT LOCAL OSCILLATOR

(75) Inventors: Pankaj Goyal, Sunnyvale, CA (US); Christopher Hull, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 12/381,117

(22) Filed: Mar. 6, 2009

(65) Prior Publication Data

US 2010/0225407 A1 Sep. 9, 2010

(51) Int. Cl.
*H03B 5/00* (2006.01)

(52) U.S. Cl. .................... 331/185; 331/183; 331/177 V; 331/117 R; 331/117 FE; 331/167; 332/124; 332/136; 332/127

(58) Field of Classification Search .............. 331/177 V, 331/108 C, 36 L, 117 R, 117 FE, 176, 185, 331/186, 167; 332/127, 124, 136
See application file for complete search history.

(56) References Cited

U.S. PATENT DOCUMENTS

| | | | | |
|---|---|---|---|---|
| 5,477,194 | A * | 12/1995 | Nagakura | 331/10 |
| 6,323,735 | B1 * | 11/2001 | Welland et al. | 331/36 L |
| 7,881,402 | B2 * | 2/2011 | Gao et al. | 375/296 |
| 2004/0152437 | A1 | 8/2004 | Behzad | |

OTHER PUBLICATIONS

Non-Final Office Action mailed Sep. 8, 2010 for German Patent Application No. 10 2009 060 263.1.

* cited by examiner

*Primary Examiner* — Arnold Kinkead
(74) *Attorney, Agent, or Firm* — Blakely, Sokoloff, Taylor & Zafman LLP

(57) ABSTRACT

With some embodiments, a VCO (voltage controlled oscillator) operates at an integer multiple (N) above a desired transmission frequency. In accordance with one embodiment, a chip is provided with a VCO to generate a signal and a frequency dividing circuit to provide a reduced frequency version of the signal to a transmit mixer. The transmit mixer is followed by a power amplifier that is on the same die as the VCO. The power amplifier is to generate an OFDM output transmission.

15 Claims, 5 Drawing Sheets

INTERFERENCE RESISTANT LOCAL OSCILLATOR

BACKGROUND

High frequency generator circuits such as voltage controlled oscillators (VCOs) are used as local oscillators (LOs) for mixing signals in order to transmit and/or receive information, e.g., over a wireless or wired channel. With higher transmission frequencies (e.g., above 1 GHz), it is difficult to generate a "clean" high frequency signal. Conventional methods of LO generation have large harmonics and spurs that can desensitize the receiver and create spectral compliance challenges for the transmitter. The noise on the LO can mix with blockers and desensitize the receiver. It can be even more of a challenge when the various transceivers supporting different frequency bands are implemented in a single chip. For example the unwanted spectral tones of a local oscillator can interfere with a receiver section of another transceiver.

Direct conversion transmitters are desired for low cost, small size and reconfigurable modulation bandwidth. The frequency generator, the VCO, phased locked using a PLL to a crystal oscillator is needed for up-conversion. A VCO running at the transmit frequency, however, can suffer from frequency pulling by the transmit amplifier. For higher-power transmit amplifiers, the high power section may be separated and shielded (e.g., different chip in a metal-enclosure) from the VCO (or VCO could be implemented with a separate shielded chip) circuit to inhibit interference from the high power transmitter back to the sensitive VCO circuit. Unfortunately, it may be less desirable to use separate chips due to cost reasons, but with present approaches, if implemented in a single chip, the VCO may be detrimentally interfered with by the higher power section. Some transceiver solutions have involved splitting up the conversion into several stages so that the higher power stage like a transmit power amplifier is at a different frequency than the VCO used in the local oscillator. But this requires more than one VCO and possibly more than one PLL. The other so called direct conversion solutions generate the LO signal indirectly from a VCO that is offset from the carrier frequency. For example, if a 6 GHz transmission frequency is desired, a VCO may be used to generate a 4 GHz signal, which can be divided to obtain a 2 GHz component. The 4 GHz and 2 GHz signals are then used to attain the desired 6 GHz LO signal. Unfortunately, this requires additional circuitry (mixers, etc.). Because of frequency mixing the LO spectrum may contain unwanted components at 2 GHz, 4 GHz, 8 GHz etc in addition to desired 6 GHz components, requiring in some cases, tuned circuits to reduce these levels. These circuits as well as the mixer used for LO generation also need large inductors, which consume more power and chip area and make the solution expensive. Accordingly, new approaches are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In some embodiments, interference affecting local oscillators can be reduced by using approaches disclosed herein. The approaches may be suitable not only for low power transmitters, but also for medium to high power transmitters. With some embodiments, a VCO (voltage controlled oscillator) operates at an integer multiple (N) above the desired transmission frequency. The VCO may be phase locked at the integer or fractional multiple to a stable reference oscillator (crystal oscillator). The VCO signal may be distributed to multiple radios at the higher frequency and a divide-by-N frequency divider may be used between a distribution amplifier and a Tx/Rx so that its mixer(s) operate with a local oscillator (LO) signal at the target transmission frequency. It is easier to resist interference in the VCO when it runs at a different (e.g., higher) frequency than that used for transmission in the higher power section(s). In addition, in some embodiments, techniques such as silicon isolation and the use of noise resistant inductors may also and/or alternatively be used in the VCO to make it more resistant to interference.

Figure 1A:
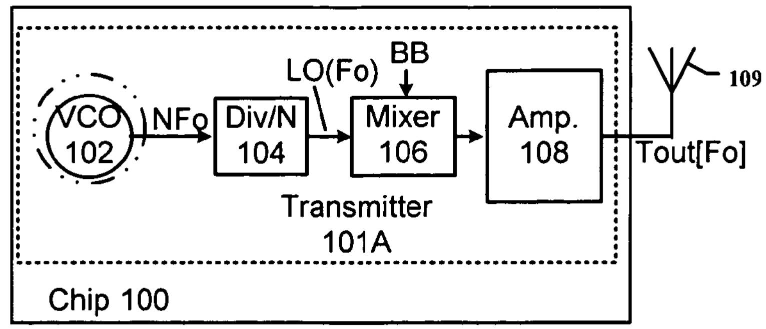
FIG. 1A is a diagram of a portion of a transmitter with an interference resistant local oscillator in accordance with some embodiments.
Figure 1B:
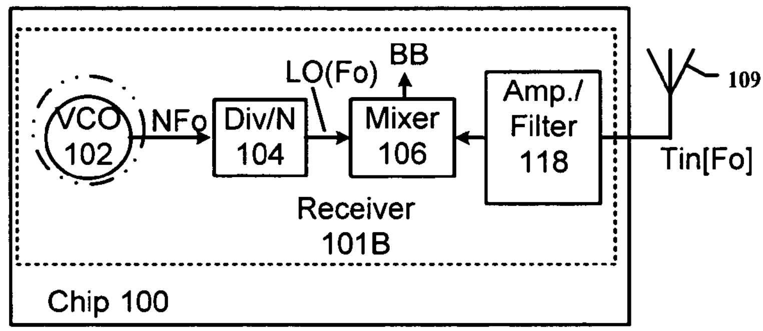
FIG. 1B is a diagram of a portion of a receiver with an interference resistant local oscillator in accordance with some embodiments.

FIGS. 1A and 1B show general block portions of a transmitter and receiver, respectively, with interference resistant local oscillators in accordance with some embodiments. They are on a chip 100 and may or may not be part of a common transceiver. They each include a VCO 102, divide-by-N circuit 104, mixer 106, amplifier 108, and antenna 109, coupled as shown. The amplifier 108 corresponds to a higher power amplifier and/or filter to transmit the signal through the antenna (transmitter 101A case) or to receive it from the antenna 109 (receiver 101B case). In the case of the transmitter, a baseband (BB) signal is mixed with the local oscillator signal, LO (Fo), generating a signal (Tout(Fo)) at the output of the amplifier 108. In the case of the receiver 101B, the received transmission signal (Tin(Fo)) is mixed with the local oscillator signal (LO(Fo)), generating the baseband signal (BB).

The VCO is made to generate a signal at a frequency that is N times larger than that desired for transmission. (It should be noted that the term transmission is intended to refer to both transmitting and receiving. That is, a signal at a transmission frequency may be received or transmitted. In addition, along these lines, the transmission frequency refers to the frequency used at a mixer or modulator for a higher power stage. It encompasses schemes whereby the transmitted signal may be spread or modulated, albeit possibly slightly in some cases, depending upon the utilized transmission scheme, e.g., WiMax, WiFi, GPS, etc.) A divide-by-P circuit may be interposed between the VCO and a PLL (phase locked loop), referenced at Fc (e.g., from a crystal clock generator), to control the VCO to run at PFc (PFc=NFo). The divide-by-N block 104 divides the VCO generated signal (which is at NFo) to be at the desired transmission frequency (Fo).

In some embodiments, as discussed herein, the VCO may be made to be more resistant to interference from the transmitted signal. For example, silicon isolation methods like multiple guard rings interleaved with high-resistance channels may be employed, numerous different down-bonds may be used for these guard rings and the power supplied to the VCO may be provided in a manner so as to enhance VCO stability. In addition, since the VCO is to operate at a relatively high frequency, when employing a tank circuit configuration, the utilized inductor can be made smaller and as taught herein, can be made to be more resistant to electro-magnetic interference.

Figure 2:
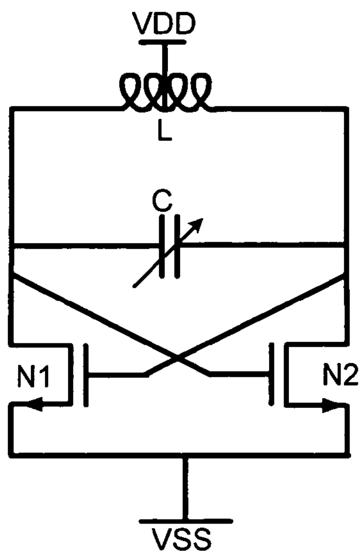
FIG. 2 is a diagram of a voltage controlled oscillator in accordance with some embodiments.

FIG. 2 generally shows an exemplary tank-based VCO circuit for use with the circuits of FIG. 1. It comprises cross-coupled transistors N1 and N2, variable capacitor C, and inductor L, coupled as shown. Supply power (VDD) for the VCO may be provided through a center tap of the inductor. While any suitable way may be used to control the generated frequency based on a control signal (voltage or current, even though the circuit is referred to as a voltage controlled oscillator), a varactor (variable capacitor, typically voltage controlled) is commonly used for controlling the capacitance in the tank and thus the generated frequency. (The generated frequency in a tank circuit is normally $1/[2\pi\sqrt{(LC)}]$.) Thus, by operating the VCO at a higher frequency, the inductor and/or capacitor blocks can be made smaller. In the case of the inductor, this can enable more flexible inductor designs for resisting interference.

Figure 3A:
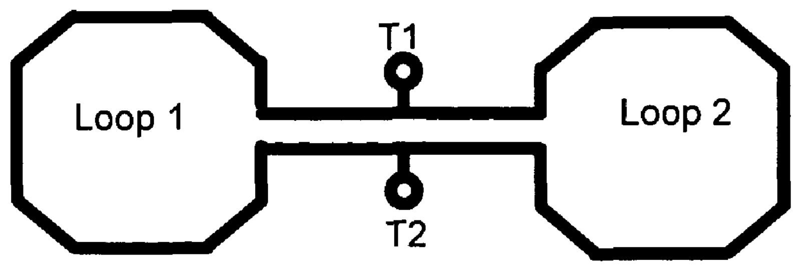
FIGS. 3A-3D show inductor geometries in accordance with some different embodiments.
Figure 3B:
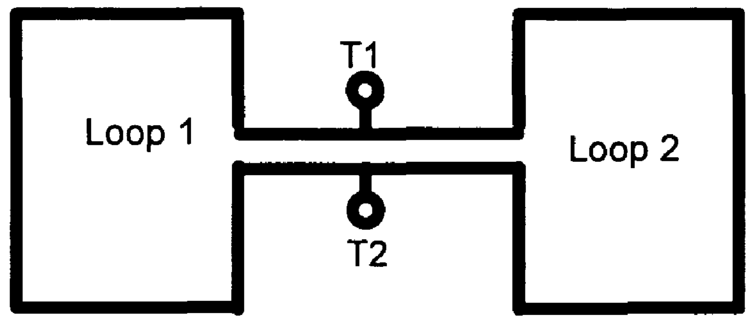
Figure 3C:
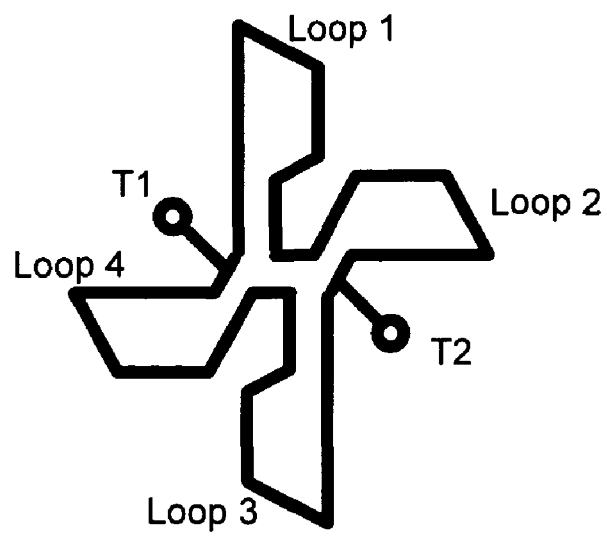
Figure 3D:
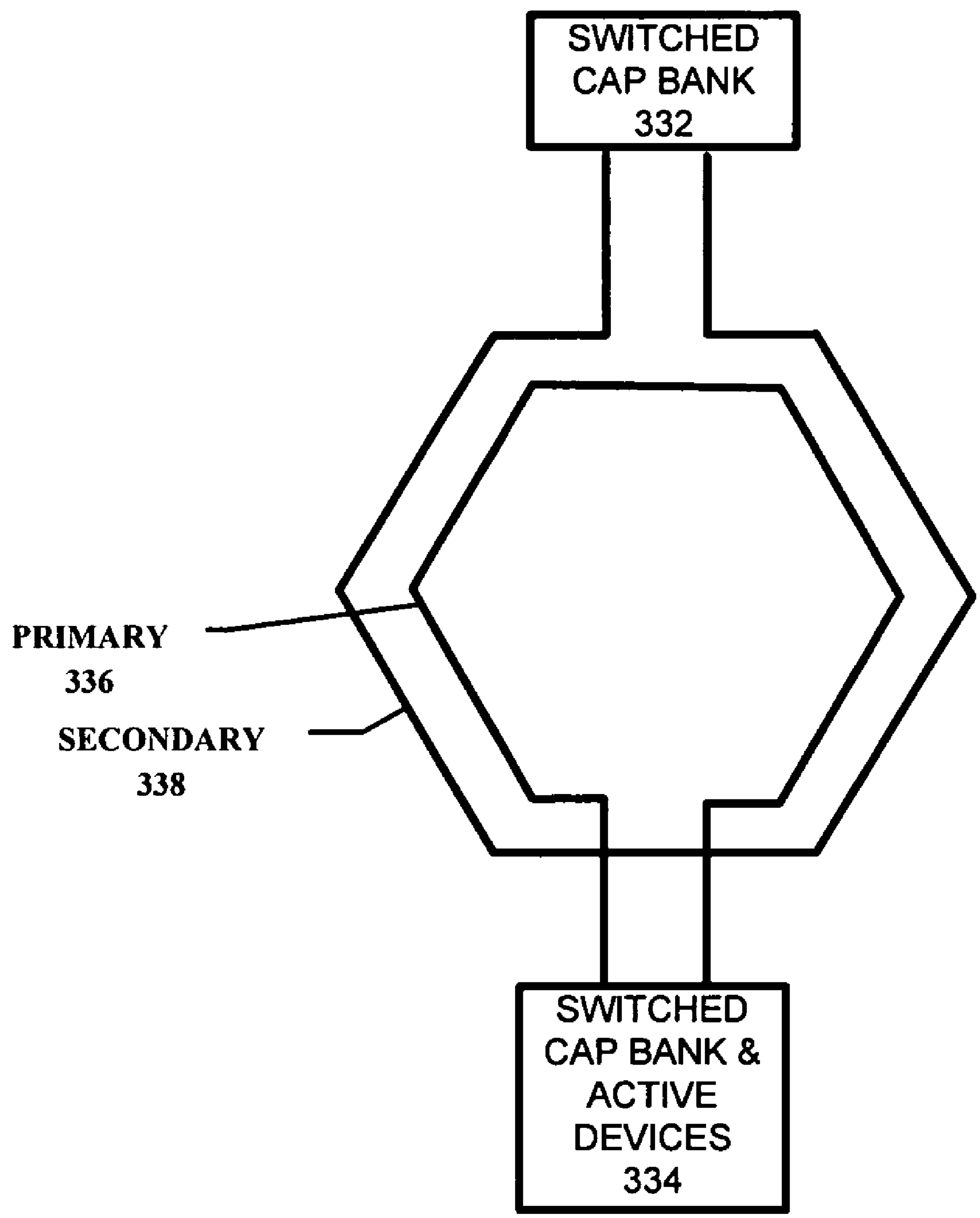

FIGS. 3A to 3D show different embodiments for implementing planar, interference resistant inductors (integrated on a chip) that may be used. The inductors in FIGS. 3A-3C have terminals, T1 and T2, and are generally designed to have somewhat symmetrical loops (Loop 1 and Loop 2). They may also have a center tap located between the terminals on either loop. The inductor of FIG. 3D is a coupled inductor with primary and secondary windings 336 and 338. (Also shown in this figure are block sections, 332 and 334, where capacitor banks and active circuitry for the VCO may be located relative to each other in a chip.) The inductors may be disposed (or oriented) so that interference (that would otherwise be picked up and incorporated into the electrical signal in the inductor) is electrically cancelled in the loops, akin to interference encountering twisted differential pair lines. That is, the radiation reaching the inductor couples to two (or more) symmetrical structures and cancel out, at least to a given extent, depending on the circuit layout By optimizing the relative orientation of the inductor to the direction of magnetic interference, maximum cancellation of interference can be achieved. For example, with the inductor of FIG. 3A, interference hitting the inductor between the loops, e.g., along an axis dividing the loops, will be cancelled the most since electrical signals from the interference are generated in opposite polarities in the loops and cancel each other to the extent that the magnetic field is identical in the two loops. It was contemplated that using multiple loops, e.g., four or more, akin to the inductor of FIG. 3C, would yield better interference resistance since the quality of cancelling would be less dependent on the direction of the oncoming interference. However, it was experimentally determined that disadvantages resulting from additive interference outweighed the benefits of reducing orientation sensitivity. Regardless, there are many different geometries that may be employed, providing improved interference resistance for a VCO and are contemplated within the scope of the invention. Also, multiple such inductors may be used if necessary in a given VCO circuit. Use of these structures in appropriate orientation may allow the blocks to be closely spaced to minimize area without compromising performance.

The inductor(s) can be further protected from magnetic interference using shielding rings around them that allow current flow in a circular loop. For example a low impedance circular loop may be used to enclose the inductor and will minimize the radiation pickup. However, it should be remembered that the use of such a closed conductive path outside the inductor may degrade the Q of VCO tank.

Figure 4:
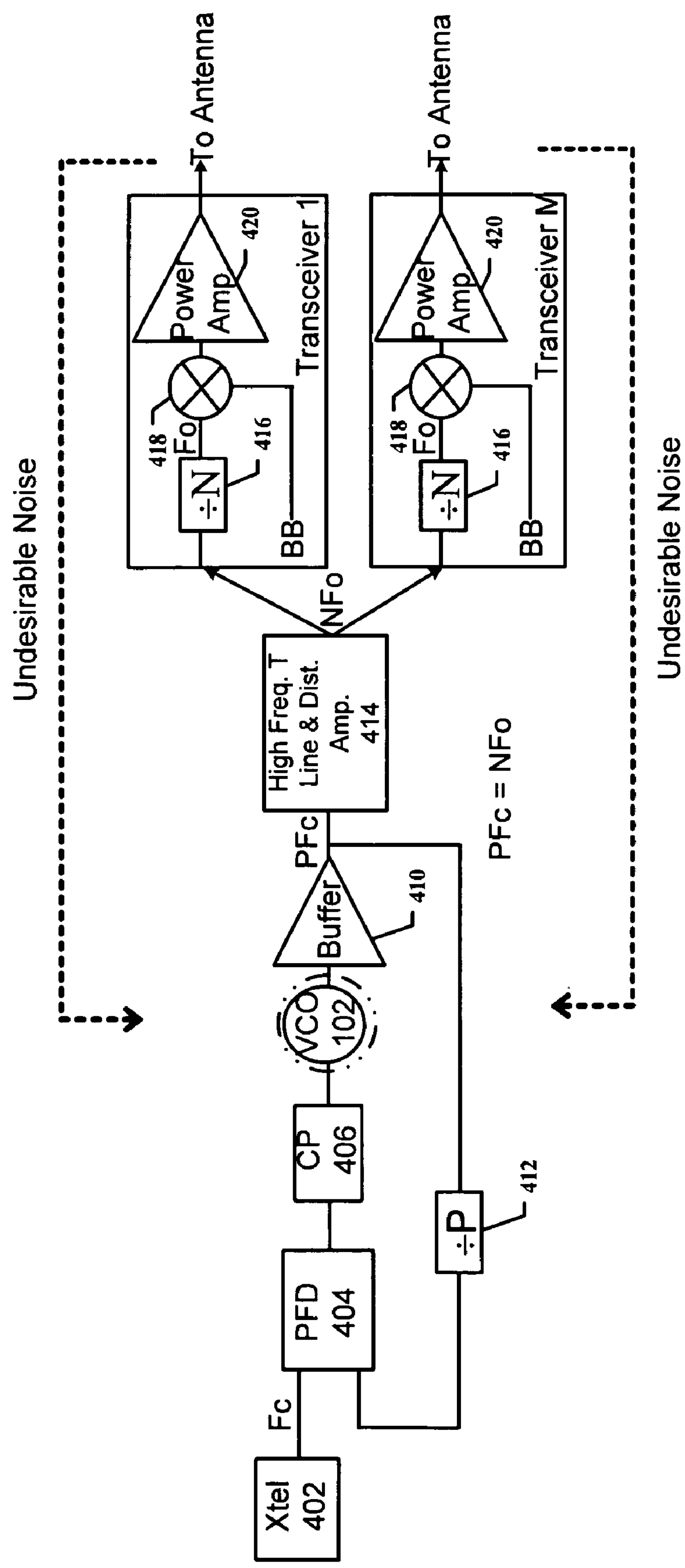
FIG. 4 is a diagram of a transmission system with an interference resistant LO in accordance with some embodiments.

A transformer (or coupled inductor) such as that shown in FIG. 3D can also be used to reduce coupling while assisting in frequency tuning. The VCO may comprise an inductor, mostly constituted from the primary winding 336, and cap bank and active devices 334. The secondary winding 338 may be connected to another switched cap bank 332, or a simple switch, to provide a closed path, or a switched inductance, to increase the tuning range of the main tank circuit while enhancing immunity to radiation pickup FIG. 4 shows a diagram of a transceiver (transmitter and/or receiver) system with an interference resistant local oscillator including an interference resistant VCO 102. The VCO 102, along with phase frequency detector (PFD) 404, charge pump 406, buffer (amplifier) 410, and divide-by-P block 412 make up a phase locked loop referenced off of a crystal clock 402. (For simplicity, other circuit elements have been omitted. for example, components could be included for adjusting the frequency (Fc), e.g., for carrier recovery or aligning the crystal reference frequency to base-station frequency. Moreover, any suitable PLL type, e.g., integer or fractional type, may be employed. Sigma-delta modulation may be used inside the loop to reduce the noise. In addition, a digital or analog loop filter may be used in the PLL, or an all digital PLL could be employed. The buffer 410 provides the signal generated from the VCO (with frequency PFc) to a high frequency Transmission line (T line) and distribution amplifier 414, which feeds the higher frequency signal to one or more transceivers, Transceiver 1 through Transceiver M. The transceivers each include a divide-by-N block 416, mixer 418, and higher power amplifier 420 to mix a divided down signal (at frequency Fo) with a baseband (BB) signal. The distances traversed by signals between the VCO 102 and mixer 418 may be relatively long and thus it is advantageous to route the signal(s) from the VCO at higher frequencies and then divide them down to the desired transmit frequency once at the transceiver. The distance between the divide-by-N block 416 and mixer 418 should also be minimized.

With additional reference back to FIGS. 1A and 1B, Placing the divide-by-N block 416 close to the up/down conversion mixer, 418, reduces the on-frequency coupling to the substrate from the divider 416 output to a low noise amplifier, e.g., LNA 118 from FIG. 1B, which could interfere with Rx operation. The higher power transmissions will generate undesirable noise that leaks back to the VCO. This includes the noise, e.g., harmonics, generated in the high power section 108. Strong second harmonics from the supply node of high power amplifier 108 can also couple to the VCO. The sensitivity of the VCO to the noise from power amp. 108 may be reduced by reducing the magnetic flux at the power amplifier, as well as by designing the VCO to be resistant to radiation pickup at that frequency. In addition, the high frequency noise at several points in the circuit may be suppressed by using reactive elements like capacitors or LC series resonant filters. These reactive elements and filters may be designed using lumped elements or distributed transmission lines. Fortunately, it is easier to filter out the lower frequency noise which is generated due to the modulation envelope of the PA.

In addition, the VCO 102 may include one or more features to make it more resistant to interference produced at the higher power transceivers. For example, filtering at various, more sensitive nodes in the VCO may be employed. Also, silicon isolation may be used. This may involve using more than one down-bond for the VCO and multiple guard rings can be used to minimize the substrate pickup. Guard rings should be tied to a clean ground using multiple down-bonds. When multiple guard rings are used, they should terminate at different ground and supply connections in order to avoid corrupting the quieter ring from getting corrupted by the noisier ground.

Interference resistant inductors, as previously discussed, can also be used to reduce magnetic coupling. Furthermore, as discussed below with reference to FIG. 5, a power supply with a high Power Supply Rejection Ratio (PSRR) for the VCO may be used to enhance VCO frequency and phase stability' (phase noise performance) and operation.

The value of frequency division ratio N may be any suitable number, e.g., 2, 3 or some other number. For example, in an embodiment of a WiFi radio, with a 5.5 GHz transmission frequency (Fo), N could be 2 and thus the VCO could be operated at 11 GHz. An appropriate value for N may be selected based on given design requirements. The value should be chosen that makes a good compromise between operating performance parameters and the size of inductor. A small value of N implies an easier design, but it generally requires a larger chip area due to a larger size needed for the inductor. A larger inductor size also implies that more lines of flux can be intercepted and hence result in a stronger pickup for injection pulling in the VCO. In some embodiments, a large N may improve the VCO phase noise by 6 dB for every divide-by-2 operation. Along with VCO phase noise reduction, noise picked up by the VCO, which may appear as FM sidebands, also may be reduced by the same factor. However, too large a value of N results in a very high VCO frequency operation, which may reduce the tuning range, although the tuning range may be compensated by using multiple VCOs. Since the inductor size is very small at high frequencies, multiple VCOs do not necessarily have to consume too much chip area and the method can provide a clean local oscillator. In addition, a smaller N value gives lower improvement in interference resistance from the power section. With that being said, in some embodiments, a value of 2 may be perfectly suitable.

Figure 5:
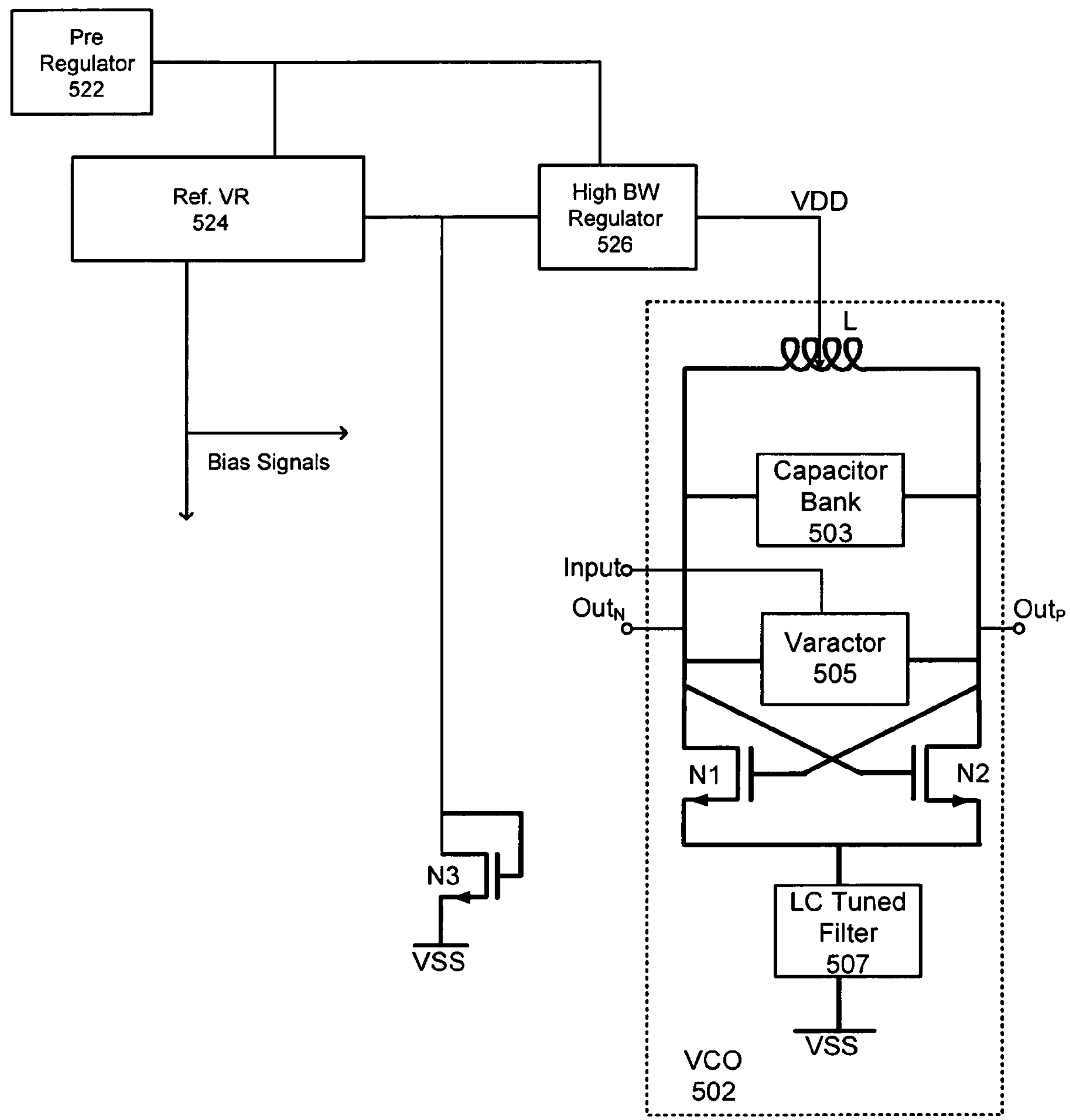
FIG. 5 is a diagram of a VCO with a power delivery system in accordance with some embodiments.

FIG. 5 shows a VCO 502 that may be used as a VCO 102 in FIGS. 1 or 4. The VCO comprises transistors N1, N2, inductor L, capacitor bank 503, voltage controlled varactor 505, and LC tuned filter 507, all coupled together as shown. The VCO is powered using a combination of regulators to provide a suitable VDD for enhancing the stability and noise resistance of the VCO. The supply comprises a pre regulator 522, which supplies a regulated voltage supply to a bandgap reference (VR) 524 (the block 524 also contains a PTAT current source used to generate a reference voltage by supplying a regulated current to a replica transistor N3) and to a high bandwidth regulator 526. The bandgap reference VR 524 is made to provide a highly accurate reference voltage that is reasonably insensitive to environmental changes such as changes in temperature. For example, it could include biasing circuits like regulators. A dedicated Band-gap reference circuit can be used to ensure noiseless operation. A Proportional To Absolute Temperature (PTAT) circuit may be used to cancel the changes in the circuit behavior over temperature changes, thus stabilizing the operation and ensuring startup over temperature variations. The reference regulator is used to not only provide a precision regulated reference voltage to the high bandwidth regulator 526, but also, it provides the various bias control signals to the VCO. For example, the control logic of the capacitor bank 503 may be coupled to a bias signal for controlling its capacitance. The reference voltage provided to the high bandwidth regulator 526 is generated through a diode-connected replica transistor N3, which is made to reasonably match and be proximal to the transistors N1, N2 used in the VCO. This makes the VCO functionality less sensitive to process deviations and the like.

The higher bandwidth regulator is made to have a sufficiently high bandwidth substantially more than the modulation bandwidth of the transmitter to have sufficient responsiveness for supplying the VCO relative to the frequency that it is generating. The regulator should be internally compensated in order to avoid high frequency pickups such as from bond-wire coupling, and it should be made low noise to keep the phase noise low. With the use of separate regulators, overall power supply noise rejection can be achieved, e.g., via the reference regulator and pre regulator 522, without having to suffer limited responsiveness since it is attained through the separate higher bandwidth regulator 526. The entire bias circuit is dedicated to the VCO circuit and is enclosed along with the VCO within the previously mentioned guard rings to avoid picking up the noise through the substrate.

The varactor for the VCO should be designed to be small enough to have a reduced VCO tuning sensitivity (also called KVCO) such that any noise coupling to a tuning line has a minimal impact. A small varactor size will provide a small, non-linear capacitor and hence lower phase noise. However, too small a varactor can result in two issues. First, any thermal gradients during a Tx slot may change the operating frequency, which is corrected by the PLL by changing the tuning voltage, a small varactor can have a limited frequency correction and may unlock the PLL unless a new capacitor value is switched in the capacitor bank. Second, a very small varactor may not have enough tuning range to provide sufficient overlap in the fixed (e.g., switchable) capacitor(s) of the tank. Further, the control logic to the VCO block is passed through logic buffers which are located within the guard rings along with the VCO, and these logic buffers are powered by the clean power supply generated by the dedicated biasing circuits within the guard ring.

Figure 6:
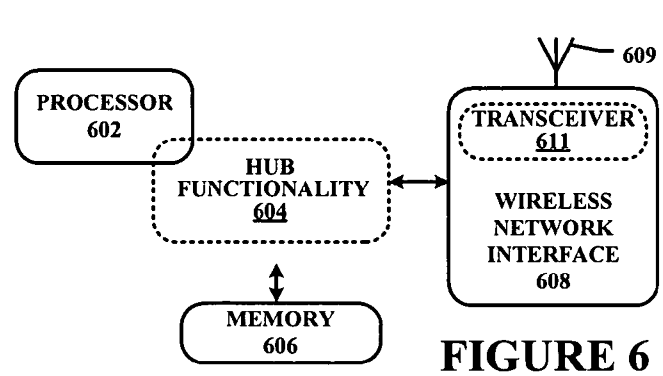
FIG. 6 is a diagram of a computer system with a transceiver having an LO with interference resistance in accordance with some embodiments.

With reference to FIG. 6, one example of a portion of a computing platform (e.g., computing system such as a mobile personal computer, PDA, cell phone, or the like) is shown. The represented portion comprises one or more processors 602, hub functionality circuit 604, memory 606, wireless network interface 608, and an antenna 609. The processor 602 is coupled to the memory 606 and wireless network interface 608 through the hub functionality block 604. The hub functionality may comprise one or more circuit blocks to perform various interface control functions (e.g., memory control, graphics control, I/O interface control, and the like. These circuits may be implemented on one or more separate chips and/or may be partially or wholly implemented within the processor 602.

The memory 606 comprises one or more memory blocks to provide additional random access memory to the processor 602. It may be implemented with any suitable memory including but not limited to dynamic random access memory, static random access memory, flash memory, or the like. The wireless network interface 608 is coupled to the antenna 609 to wirelessly couple the processor 602 to a wireless network (not shown) such as a wireless local area network or a cellular network. it includes one or more transceivers 611 with interference resistant VCOs as discussed herein.

The computer platform may implement a variety of different computing devices or other appliances with computing capability. Such devices include but are not limited to laptop computers, notebook computers, personal digital assistant devices (PDAs), cellular phones, audio and/or or video media players, and the like. It could constitute one or more complete computing systems or alternatively, it could constitute one or more components useful within a computing system. In addition, the block diagram could correspond to a system on chip (SOC) platform implemented on a single chip or in a single package.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network-chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip comprising:

a voltage controlled oscillator (VCO) to generate a signal;

a frequency dividing circuit to provide a reduced frequency version of the signal to a transmit mixer followed by a power amplifier that is on the same die as the VCO; and a power regulator including a bandgap reference regulator and a higher bandwidth regulator to provide power to the VCO.

2. The chip of claim 1, wherein the frequency dividing circuit is a divide-by-N circuit.

3. The chip of claim 1, wherein the power amplifier is to generate an orthogonal frequency-division multiplexing (OFDM) output transmission.

4. The chip of claim 1, wherein the VCO comprises a tank with a varactor to control the frequency of the VCO.

5. The chip of claim, wherein the reference regulator generates a reference voltage off of a transistor matched with and proximal to one or more transistors in the VCO.

6. The chip of claim 1, wherein the value of frequency division is two.

7. The chip of claim 1, wherein the VCO is to operate at a frequency in excess of 10 GHz.

8. The chip of claim 1, wherein the VCO comprises a noise resistant inductor.

9. The chip of claim 8, wherein the noise resistant inductor comprises one or more pairs of substantially symmetrical loops.

10. The chip of claim 1, wherein the VCO provides its generated higher frequency signal over a distribution amplifier to multiple mixers at remote distances from the VCO on the die.

11. A computer system comprising:

a processor; and a wireless interface coupled to the processor to communicative link the processor to a wireless network, the wireless interface comprising:

at least one local oscillator on a chip, the local oscillator including a voltage controlled oscillator (VCO) to provide a signal at N times a transmission frequency, a divide-by-N circuit to divide the signal from the VCO by N to be provided at the transmission frequency to a mixer for a higher power stage that is on the same die as the VCO, and a power regulator comprising a reference regulator and a higher bandwidth regulator to provide power to the VCO.

12. The system of claim 11, wherein the VCO comprises a tank with a varactor to control the frequency of the VCO.

13. The system of claim 11, wherein the reference regulator generates a reference voltage off of a transistor matched with and proximal to one or more transistors in the VCO.

14. The system of claim 11, wherein the value of N is two.

15. The system of claim 11, wherein the VCO is to operate at a frequency in excess of 10 GHz.

* * * * *

UNITED STATES PATENT AND TRADEMARK OFFICE

CERTIFICATE OF CORRECTION

PATENT NO. : 8,169,271 B2
APPLICATION NO. : 12/381117
DATED : May 1, 2012
INVENTOR(S) : Goyal et al.

It is certified that error appears in the above-identified patent and that said Letters Patent is hereby corrected as shown below:

In the Claims

Column 8, line 63, Claim 11 delete, “A computer system” and insert -- A system --.

Column 8, line 65-66, Claim 11 delete, “communicative” and insert -- communicatively --.

Signed and Sealed this
Twenty-second Day of April, 2014

Michelle K. Lee
*Deputy Director of the United States Patent and Trademark Office*